United States Patent [19]

Mote, Jr.

[11] Patent Number: 5,324,996

[45] Date of Patent: Jun. 28, 1994

[54] FLOATING FAULT TOLERANT INPUT BUFFER CIRCUIT

[75] Inventor: L. Randall Mote, Jr., Laguna Hills, Calif.

[73] Assignee: AST Research, Inc., Irvine, Calif.

[21] Appl. No.: 17,825

[22] Filed: Feb. 16, 1993

[51] Int. Cl.$^5$ ............................................. H03K 17/16
[52] U.S. Cl. ................................. 307/443; 307/465; 307/475
[58] Field of Search ................ 307/473, 443, 451, 465

[56] References Cited

U.S. PATENT DOCUMENTS

| | | | |
|---|---|---|---|
| 3,974,403 | 8/1976 | Georgeopoulos | 307/443 |
| 4,585,958 | 4/1986 | Chung | 307/443 |
| 4,777,389 | 10/1988 | Wu | 307/443 |
| 4,806,798 | 2/1989 | Kanauchi | 307/443 |

OTHER PUBLICATIONS

L. Randall Mote, Jr.; AST, Research, Inc. PISA Chip Real Time Clock Schematic; May 9, 1991.

Primary Examiner—Edward P. Westin
Assistant Examiner—Andrew Sanders
Attorney, Agent, or Firm—Knobbe, Martens, Olson & Bear

[57] ABSTRACT

An input buffer circuit for voltage controlled switch based logic, such as CMOS, which tolerates a floating input voltage without damaging the transistors which form the input buffer circuit. The input buffer circuit protects the input transistors by including an inhibit signal that can be activated to prevent the connection of the system power supply to the system ground when other input signals are floating. The inhibit signal or an independent protection signal further causes the buffer circuit to provide a constant output from the input buffer circuit even when the input voltage floats. Preferred embodiments of the input buffer circuit can be programmed from an internal or external source to cause the output of the buffer circuit to be at an inactive high level or to be at an inactive low level in accordance with whether the input signal being buffered is an inactive high signal or an inactive low signal.

4 Claims, 3 Drawing Sheets

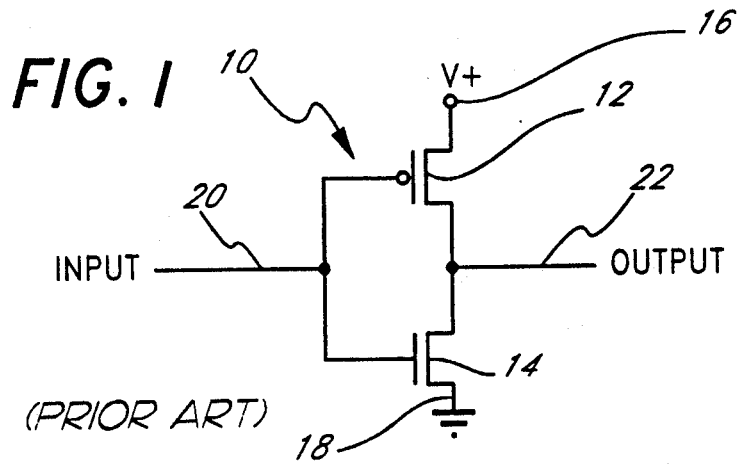
FIG. 1 (PRIOR ART)
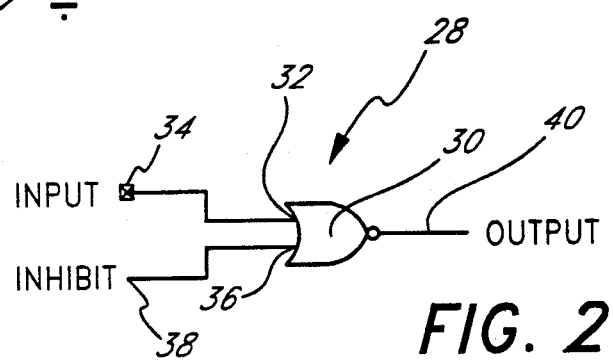
FIG. 2
| INHIBIT 38 | INPUT 34 | OUTPUT 40 | |
|---|---|---|---|
| 0 | 0 | 1 | OUTPUT INVERTED |
| 0 | 1 | 0 | |
| 1 | 0 | 0 | OUTPUT INHIBITED |
| 1 | 1 | 0 | |
FIG. 3
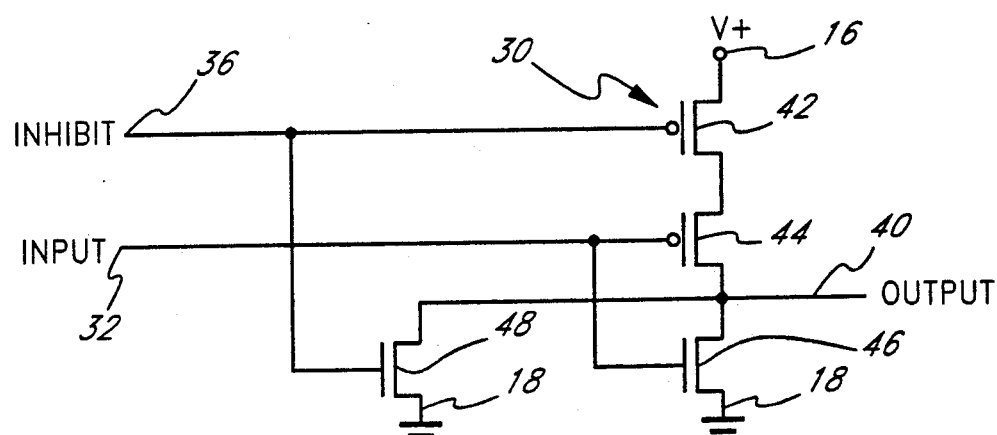
FIG. 4

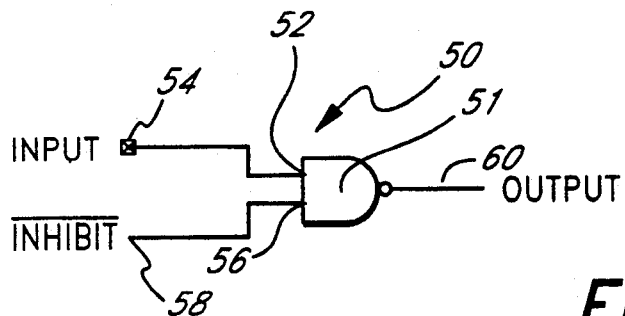
FIG. 5
| INHIBIT | INPUT | OUTPUT | |
|---|---|---|---|
| 0 | 0 | 1 | } OUTPUT INHIBITED |
| 0 | 1 | 1 | |
| 1 | 0 | 1 | } OUTPUT INVERTED |
| 1 | 1 | 0 | |
FIG. 6
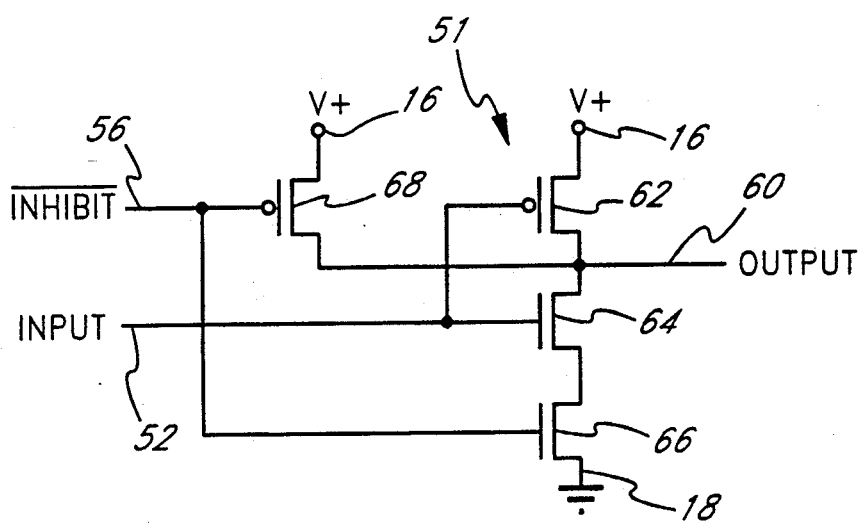
FIG. 7

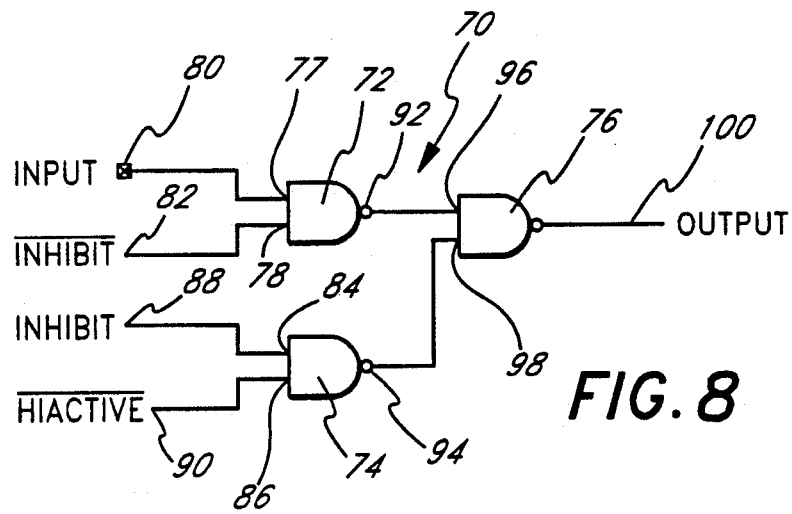
FIG. 8
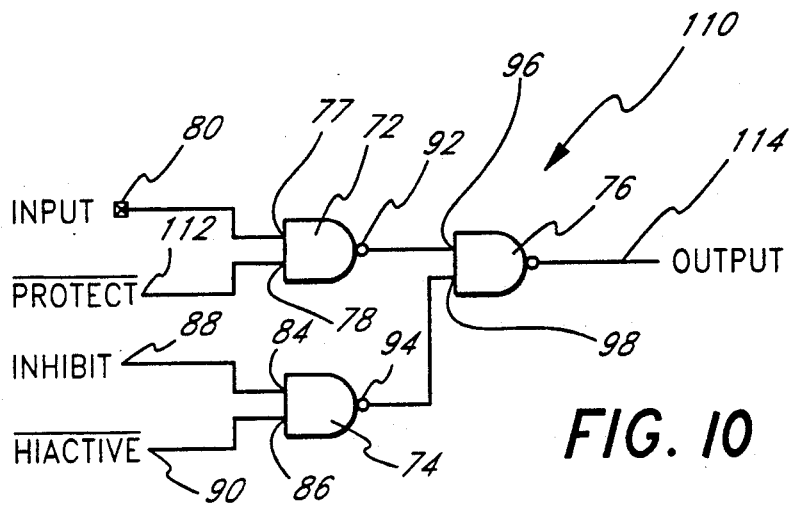
FIG. 9
FIG. 10

FLOATING FAULT TOLERANT INPUT BUFFER CIRCUIT

FIELD OF THE INVENTION

The present invention relates to the field of input buffers for integrated circuits comprising logic elements which have voltage controlled inputs, such as, for example CMOS integrated circuits.

BACKGROUND OF THE INVENTION

Recently, system power management has become an important area in the electronics industry. More specifically, reducing the amount of power required to maintain a system in an operational state has become one of the main focuses of the industry. One of the ways in which the system power is conserved is to remove power from non-essential areas of the system during certain periods of operation. By powering down certain portions of a system which are not currently in use, the outputs of the powered down portions of the system become unregulated. Therefore, the inputs of the operational portion of the system are not always receiving an input signal which is at a normal operational voltage level. The unregulated voltage received at these inputs can float from anywhere between zero volts up to the full power supply voltage. These so called floating input voltages are applied to the CMOS input buffers on conventional CMOS Integrated circuits (ICs), Gate Arrays and other Application Specific Integrated Circuits (ASICs). The application of these floating input voltages can cause the transistors which form the input buffer to burn out. The input buffers burn out when the floating input voltages reach a level which is high enough to turn ON one of the transistors of the input buffer while not being high enough to turn OFF the other transistor. This results in two transistors which are intended to be ON for different input conditions both being weakly turned ON at the same time. When both transistors are weakly ON, the system power is shorted to ground. By shorting power to ground, a high level of current runs through the transistors and burns them out. When the input buffers burn out, the entire chip is inoperative and must be replaced.

Current methods used in the electronics industry to avoid the shortage of power to ground caused by floating inputs include the connection of a pull-up resistor or a pull-down resistor to the inputs on the CMOS IC. The pull-up resistor connects the input pin of the CMOS IC to system power through the pull-up resistor. Using a pull-up resistor on an input buffer is disadvantageous, because an input left in a logic high state could power logic external to the IC through the external device's input/output protection diodes. If the input is able to power the external logic, the input buffer would become loaded down causing the input voltage to decrease to a voltage sufficiently low to turn ON both input transistors of the CMOS gate, thus having the potential to short the system power supply to the system ground. In addition, a pull-up resistor dissipates power when the input signal has a low logic level and current flows from the system power through the pull-up resistor to ground.

In a similar manner, the pull-down resistor connects the input pin of the CMOS IC to system ground. The main disadvantage in using a pull-down resistor is that whenever the input is driven high by the external logic, power is dissipated through the pull-down resistor. The total system power which is dissipated is a function of the number of inputs with pull-down resistors and the resistance value of each pull-down resistor. The level of dissipation caused by pull-down resistors may be considerable for many low power systems.

Another protection method which is used for CMOS ICs is the replacement of the CMOS input buffers with bipolar input buffers. One disadvantage of using a bipolar input buffer is that bipolar transistors have a higher power dissipation than CMOS transistor. Additionally, by mixing CMOS and bipolar technologies on the same IC, the manufacturing costs of the IC are considerably higher. Another option would be to move the bipolar input buffers off the chip and use external bipolar input buffers. However, the problems associated with the higher power dissipation of the bipolar buffers still exists. A further disadvantage includes the costs of adding additional components to the system. Lastly, components that are added to the system take up valuable circuit board real estate which is an important factor in the design of many portable electronic systems.

A further method currently used to protect floating inputs entails driving a zero from the input pin when the external logic is powered off, thus providing the input buffer with a constant zero voltage rather than a floating voltage value. The main disadvantage of the zero driving solution is that it may cause additional power dissipation. In addition, by driving a zero out for power down conditions, all input signals must normally be active high signals to enable them to ignore the zero input when the power is down. Requiring all signals to be active high signals may cause problems in the system logic if the input is not originally intended to be an active high signal. Lastly, an external pull-down resistor may still be needed to prevent burn out of the input buffer during the transition periods before and after the application of the zero voltage.

From the forgoing, it can be seen that a need continues to exist in the prior art for a CMOS input buffer which can tolerate a floating input without requiring external components to protect the input and without causing additional demands on the capacity of the system power.

SUMMARY OF THE INVENTION

The present invention comprises a CMOS input buffer circuit which can tolerate a floating input voltage without burning up the CMOS transistors which make up the input buffer. The CMOS input buffer circuit of the present invention has many improved features over prior art input buffers. One feature protects the input transistors by preventing the shorting of the system power to the ground. Another feature provides a constant output of the input buffer even when the input voltage floats.

A preferred embodiment of the CMOS input buffer circuit comprises a dual-input CMOS buffer which combines the input pin voltage with an internally or externally generated inhibit voltage to prevent the floating input voltage from burning out the transistors in the input buffer. Variations in the CMOS input buffer are provided to accommodate both active high and active low input signals. A preferred embodiment of the CMOS input buffer circuit can be programmed from an internal or external source to adapt the input buffer circuit to accommodate either active high or active low signals after the CMOS part has been manufactured. In another preferred embodiment, the protection feature of the input buffer is separately controllable from the constant output voltage feature of the present invention.

One aspect of the present invention is a method for preventing a floating input signal from damaging an integrated circuit connected between first and second voltage sources. The method comprises the steps of providing an input buffer circuit having at least first and second inputs. The input signal is applied to the first input. The input signal has first and second voltage values corresponding to first and second logic states. The input signal further has a floating voltage value between the first and second voltage values. The method also includes the step of applying a control signal to the second input. The control signal is forced to a first state when the input signal has one of first and second voltage values so that the input buffer circuit operates to provide an output signal responsive to the input signal. The control signal is forced to a second state when the input signal has the floating value so that the input buffer circuit operates to force the output signal to a predetermined state irrespective of the floating value of the input signal. Finally, the method includes the step of disconnecting one of the first and second voltage sources so that the input buffer circuit cannot have a conduction path between the first and second voltage sources.

Another aspect of the present invention is a CMOS input buffer circuit which can tolerate floating voltages on an input signal applied to the circuit. The buffer circuit is connected to a first power source having a relatively high voltage and being connected to a second power source having a relatively low voltage. The buffer circuit comprises a first input that receives the input signal wherein the input signal has a voltage between the relatively high voltage and the relatively low voltage. A second input of the buffer circuit receives a control signal. The control signal has a first control state when the input signal is to be buffered and has a second control state when the input signal may be floating between the relatively high voltage and the relatively low voltage. The buffer circuit has an output. The output is forced to a known output state when the control signal has the second control state. The output is responsive to the input signal when the control signal has the first control state. The buffer circuit includes at least first, second, third and fourth transistors connected to receive the input signal and the control signal. The first and second transistors conduct in the alternative when the control signal has the first control state to cause the output signal to have a first output state when the input signal has a first input state and to cause the output signal to have a second output state when the input signal has a second input state. The third and fourth transistors operate when the control signal has the second control state. The third transistor conducts to cause the output signal to be forced to the known state. The fourth transistor interrupts current from one of the first and second voltage sources to one of the first and second transistors to prevent current flow between the first and second voltage sources through the first and second transistors, thereby preventing damage to the input buffer circuit.

Another aspect of the present invention is a logic circuit that operates as an input buffer circuit for an input signal that may float at a voltage level between a high logic level and a low logic level. The logic circuit is connected between first and second voltage sources, one of which is preferably a ground reference. The logic circuit prevents excessive current flow between the two voltage sources when the input signal is floating. The logic circuit comprises a first input terminal that receives the input signal and a second input terminal that receives a control signal. The control signal has a first control state when the input signal is operating normally. The control signal has a second control state when the input signal may be floating between the first logic level and the second logic level, such as when the circuit driving the input terminal is powered off. The logic circuit further comprises an output terminal that provides an output signal responsive to the input signal and the control signal. The logic circuit includes a first plurality of transistors connected between the first voltage source and the output terminal and a second plurality of transistors connected between the second voltage source and the output terminal. The first and second plurality of transistors are controlled by the input signal and the control signal such that when the control signal has the first control state, a first one of the transistors is turned on in response to the input signal to connect the output terminal to one of the voltage sources. When the control signal has the second control state, a second one of the transistors is turned off to disconnect one of the two voltage sources from the output terminal irrespective of the voltage level of the input signal, and at the same time, a third one of the transistors is turned on to cause the output terminal to be connected to the other of the two voltage sources.

A still further aspect of the present invention is a programmable buffer circuit for buffering an input signal that floats at a voltage level between a high logic level and a low logic level. The programmable buffer circuit comprises a first input terminal that receives the input signal. The input signal has a high input logic level, a low input logic level and a floating level. The floating level is a variable level between the high input logic level and the low input logic level. The buffer circuit includes a second input terminal that receives a control signal that has a first control signal state and a second control signal state. A third input terminal receives a programming signal. The programming signal has a first programming signal state and a second programming signal state. The buffer circuit has an output terminal that provides an output signal. The output signal has a first output logic level and a second output logic level. Logic circuitry is interposed between the first input terminal, the second input terminal, the third input terminal and the output terminal. The logic circuitry is responsive to the input signal, the control signal and the programming signal. The output signal is responsive to the input signal when the control signal has the first control state to have one of the first and second output logic levels when the input signal has one of the first and second input logic levels. The output signal has the other of the first and second output logic levels when the input signal has the other of the first and second input logic levels. The output signal is forced to a predetermined one of the first and second output logic levels when the control signal has the second control state. The predetermined one of the first and second output logic levels is determined by the programming signal. Preferably, the input signal has an active logic level and an inactive logic level, and the programming signal is selected to have a selected one of the first and second programming states so that the predetermined one of the first and second output logic levels to which the output signal is forced has the same logic level as the inactive logic level.

BRIEF DESCRIPTION OF THE DRAWINGS

FIG. 1 is an exemplary schematic of a two-transistor CMOS input buffer of the prior art which operates as an inverting gate.

FIG. 2 is a schematic of one embodiment of the input buffer gate of the present invention which operates as a two-input NOR gate.

FIG. 3 is a truth table illustrating the input combinations and outputs of the two-input NOR gate embodiment illustrated in FIG. 2.

FIG. 4 is a transistor level diagram of the two-input NOR gate embodiment illustrated in FIG. 2.

FIG. 5 is a schematic of one embodiment of the input buffer gate of the present invention which is a two-input NAND gate.

FIG. 6 is a truth table illustrating the input combinations versus outputs of the two-input NAND gate embodiment illustrated in FIG. 5.

FIG. 7 is a transistor level diagram of the two-input NAND gate embodiment illustrated in FIG. 5.

FIG. 8 is a schematic of a programmable input buffer circuit embodiment of the present invention.

FIG. 9 is a truth table illustrating the input combinations and outputs of the programmable input buffer circuit embodiment illustrated in FIG. 8.

FIG. 10 is a schematic of another embodiment of a programmable input buffer circuit of the present invention.

DETAILED DESCRIPTION OF THE PREFERRED EMBODIMENTS

FIG. 1 illustrates a typical single input CMOS buffer circuit 10 of the prior art which operates as an inverting logic gate. That is, when a signal having a first binary logic level (e.g., a logical one) is applied to the input, the output of the buffer circuit 10 has the opposite binary logic level (e.g., a logical zero), and vice versa. The buffer circuit 10 is connected between two power sources, a relatively high voltage source (for example, +5 volts), shown as V+, and a relatively low voltage source (for example, 0 volts or ground), shown as ground. It should be understood that other voltage sources may be used in some applications. For example, the ground reference may be replaced with a relatively negative voltage source, or both voltage sources may be negative or both voltage sources positive with respect to a ground reference.

The inverting logic gate comprises a first inverse logic field effect transistor (FET) 12 which is connected in series with a second true logic FET 14 between the two voltage sources (i.e., between V+ and ground). As used herein, a true logic FET is activated to conduct current when a logic one (i.e., a relatively high voltage, such as the V+ power supply voltage) is applied to its gate, and an inverse logic FET is activated to conduct current when a logic zero (i.e., 0 volts or ground) is applied to its gate. The connection shown in FIG. 1 is frequently implemented as a complementary metal-oxide semiconductor (CMOS) circuit.

As illustrated in FIG. 1, the source of the first FET 12 is connected to the drain of the second logic FET 14. A single input line 20 is connected to the gate inputs of the first FET 12 and the second FET 14. The drain of the first FET 12 is connected to the system power supply 16. The source of the second FET 14 is connected to the system ground 18. The output 22 of the single input CMOS buffer circuit 10 is taken at the series connection node of the first FET 12 and the second FET 14. The buffer circuit 10 of FIG. 1 operates in a conventional manner. When the input line 20 has a high logic level applied, the second FET 14 is turned ON connecting the output line 22 to the system ground 18. When the input line 20 has a logic low level applied, the first FET 12 is turned ON connecting the output line 22 to the system power supply 16. Thus, the buffer circuit 10 operates to invert the input signal level on the output line 20.

A significant problem associated with a single input buffer 10 of the prior art is that it cannot tolerate a floating input, i.e., the input must either be a logic high or a logic low for the buffer 10 to operate properly. When the input floats to a value which is high enough to turn the second FET 14 ON but not high enough to turn the first FET 12 completely OFF, the first FET 12 and the second FET 14 are both weakly driven ON. When both FETs are ON, current is able to flow from the system power supply 16 through the weakly turned ON first FET 12 and the weakly turned ON second FET 14 to the system ground 18, thus effectively shorting the system power supply 16 to the system ground 18. Although the two FETs may have significant resistance to the current flow because neither FET is fully ON, the magnitude of the current flowing can be substantially more than the two FETs are designed to handle. Thus, when the system power supply 16 is shorted to the system ground 18 through the two FETs, a relatively high level of current is able to flow through the first FET 12 and the second FET 14 causing the first fet 12 and the second FET 14 to burn out. With burnt out input buffers 10, the IC into which the buffer circuit 10 is incorporated is ruined. Even if the current is not sufficient to burn out the input buffer 10, the excessive supply current shortens the life of the power supply 16 when a battery is used to supply the system power.

In order to avoid excessive supply current and potential burning out the transistors in a CMOS input buffer which may be subject to a floating voltage, the present invention utilizes an input buffer circuit 28 shown in FIG. 2. The input buffer circuit 28 of FIG. 2 includes a dual-input logic gate which receives an INHIBIT signal as one of the two inputs. As discussed below, the INHIBIT signal input prevents a floating voltage on the other input pin from affecting the internal CMOS FETs.

The improved input buffer circuit 28 in FIG. 2 utilizes a two-input NOR gate 30 as an input buffer. A first input 32 to the NOR gate 30 is an INPUT pin (or line) 34 which is provided as an input connection to the buffer circuit 28 from an external device (not shown). A second input 36 of the NOR gate 30 is an INHIBIT signal on a line 38. The INHIBIT signal is selectively controlled to become active when the external device is to be powered down. The INHIBIT signal may be controlled by the external device, or it may be controlled by the circuit into which the input buffer circuit 28 is incorporated. In either case, the INHIBIT signal is intended to remain active throughout the time that the external device providing the input on the input pin 34 is powered down. For example, the INHIBIT signal may be active unless the external device is providing a power or ground signal on a specified pin, not shown. The same INHIBIT signal may control a plurality of input buffer circuits although only one input buffer circuit 28 is shown in FIG. 2.

An output 40 of the NOR gate 30 is the output of the CMOS input buffer circuit 28, and is provided to other circuits in an integrated circuit into which the buffer circuit is incorporated.

As illustrated by the truth table for the NOR gate 30 in FIG. 3, when the INHIBIT signal on the line 38 is at a logic high level, i.e., a logic one, the output 40 of the NOR gate 30 is at a logic low level, i.e., a logic zero, no matter what the voltage level of the input pin 34. Thus, when the INHIBIT signal is at a logic high level, variations in the voltage at the input pin 36 do not affect the output 40 of the input buffer circuit 28. When the INHIBIT signal on the line 38 is at a logic low, the output 40 of the NOR gate 30 is dependent upon the voltage at the input pin 36. Thus, when the voltage at the input pin 34 is expected to be floating, the INHIBIT signal is activated to suppress the variations of the voltage at the input pin 34 from affecting the output 40 of the input buffer circuit 28. More importantly, as explained below in connection with FIG. 4, the INHIBIT signal prevents a current path from being formed between the power supply and ground via the transistors in the buffer circuit 28.

FIG. 4 illustrates the CMOS transistors which form the dual-input NOR gate 30 as illustrated in FIG. 2. The NOR gate 30 comprises a first FET 42, a second FET 44 and a third FET 46 connected in series. The source of the first FET 42 is connected to the drain of the second FET 44. The source of the second FET 44 is connected to the drain of the third FET 46 at an output node connected to the output 40. The NOR gate 30 additionally comprises a fourth FET 48 which is connected in parallel to the third FET. The drains of the third FET 46 and the fourth FET 48 are connected together at the output node connected to the output 40. The sources of the third FET 46 and the fourth FET 48 are both connected to the system ground 18. The drain of the first FET 42 is connected to the system power supply 16. The INHIBIT signal on the line 38 is connected to the gate input of first FET 42 and to the gate input of the fourth FET 48. The INPUT signal on the pin 34 is connected to the gate input of the second FET 44 and to the gate input of the third FET 46. The output 40 of the NOR gate 30 is connected to the connection node of the source of the second FET 44 and the drains of the third FET 46 and the fourth FET 48. The first FET 42 and the second FET 44 are inverse logic FETs that are activated when a logic low signal is applied to their respective gates, and the third FET 46 and the fourth FET 48 are true logic FETs that are activated when a logic high level signal is applied to their respective gates.

When the INHIBIT signal on the line 38 is active (i.e., is at a logic high level), the fourth FET 48 is turned ON to connect the output 40 directly to the system ground 18, thus maintaining a constant logic low level at the output 40 regardless of the state of the INPUT signal applied to the NOR gate 30 via the line 34. In addition, the active high INHIBIT signal applied to the gate of the first FET 42 turns the FET 42 OFF to thereby prevent the connection of the system power supply 16 to the system ground 18. Thus, even if the voltage at the input pin 34 floats and turns the second FET 44 and the third FET 46 weakly ON, the presence of the INHIBIT signal keeping the first FET 42 turned OFF prevents the system power supply 16 from shorting to the system ground 18.

Conversely, when the INHIBIT signal 38 is at a logic low level, the input buffer circuit 28 operates as a conventional inverting buffer with the logic level on the output 40 being dependent upon the voltage level of the input pin 34. The output 40 will be driven to a logic high level when the voltage at the input pin 34 is a logic low level, and vice versa. The output state of the buffer circuit 28 can be inverted using a conventional inverter connected to the output 40 if a non-inverting input buffer is required for a particular application.

The improved CMOS input buffer circuit 28 of the present invention has several advantages. First, the input buffer circuit 28 provides an additional FET in series with the first FET 12 and the second FET 14 of the single cell input buffer 10 of the prior art, as illustrated in FIG. 1. The additional transistors are controlled by the INHIBIT signal 38 to prevent the system power 16 from being shorted to the system ground 18. Secondly, the improved CMOS input buffer circuit 28 adds the fourth FET 48 which is also controlled by the INHIBIT signal 38 which provides a constant low logic level output from the input buffer 28 irrespective of the voltage level at the input pin 34. Therefore, by adding a minimum of two transistors to the single-celled CMOS input buffer circuit of the prior art 10, the above-described problems associated with a floating input can be solved. Lastly, the inclusion of the CMOS input buffer circuit 28 of the present invention can be incorporated into the standard input structure of many gate arrays and integrated circuits without taking up any of the functional space reserved on the part. Many CMOS gate arrays have axillary transistors at the input of the device that the user can connect to provide a standard input buffer for the input signal. These same axillary input transistors can be connected in accordance with the input buffer circuit 28 of the present invention to achieve the desired protection features of the present invention without taking up any additional space in the functional portion of the gate array.

FIGS. 5-7 illustrate another embodiment of an input buffer circuit 50 in accordance with the present invention. As illustrated in FIG. 5, the embodiment of the input buffer circuit 51 comprises a first two-input NAND gate 51. A first input 52 to the NAND gate 51 is an INPUT pin 54. A second input 56 of the NAND gate 51 is an $\overline{\text{INHIBIT}}$ signal on a line 58. The $\overline{\text{INHIBIT}}$ signal on the line 58 is an active low signal which inhibits the variations of the voltages at the input pin 54 when the $\overline{\text{INHIBIT}}$ signal is at a logic low level. An output 60 of the NAND gate 51 is the output of the CMOS input buffer circuit 50.

FIG. 6 illustrates a Truth Table for the NAND gate buffer circuit 50 of FIG. 5. When the $\overline{\text{INHIBIT}}$ signal on the line 58 is at a logic low level, the output 60 of the NAND gate 51 is at a logic high level, irrespective of the voltage level of the input pin 54. When the $\overline{\text{IN} \overline{\text{HIBIT}}}$ signal 58 is at a logic high level, the output 60 of the NAND gate 51 is dependent upon the voltage level of the input pin 54. As illustrated, when the $\overline{\text{INHIBIT}}$ signal 58 is at a logic high level the logic level on the output 60 is the inverse of the logic level on the input pin 54.

FIG. 7 illustrates the CMOS transistors which form the dual-input NAND gate 51 as illustrated in FIG. 5. The NAND gate 51 comprises a first FET 62, a second FET 64 and a third FET 66 connected in series. The source of the first FET 62 is connected to the drain of the second FET 64 at an output node connected to the output 60. The source of the second FET 64 is connected to the drain of the third FET 66. The source of the third FET 66 is connected to system ground 18. The NAND gate 51 additionally comprises a fourth FET 68 which is connected in parallel to the first FET 62. The drain of the first FET 62 and the drain of the fourth FET 68 are both connected to the system power supply 16. The source of the first FET 62 and the fourth FET 68 are connected together at the output node connected to the output 60.

The first FET 62 and the fourth FET 68 are inverse logic FETs and are activated by a low logic level applied to their respective gates. The second FET 64 and the third FET 66 are true logic FETs and are activated by a high logic level applied to their respective gates. The $\overline{\text{INHIBIT}}$ signal on the line 58 is connected to the gate input of third FET 66 and to the gate input of the fourth FET 68. The INPUT signal on the pin 64 is connected to the gate input of the first FET 62 and to the gate input of the second FET 64.

When the $\overline{\text{INHIBIT}}$ signal on the line 58 is activated with a logic low level, the fourth FET 68 is turned ON to connect the output 60 directly to the system power supply 16, thus maintaining a constant logic high level signal on the output 60. In addition, the low logic level on the $\overline{\text{INHIBIT}}$ signal turns OFF the third FET 66 to prevent the connection of the system power supply 16 to the system ground 18. Thus, even if the voltage at the input pin 54 floats and turns the first FET 62 and the second FET 64 weakly ON, the presence of the active low $\overline{\text{INHIBIT}}$ signal on the line 58 maintains the third transistor 66 in the OFF condition and prevents the system power supply 16 from shorting to the system ground 18. When the $\overline{\text{INHIBIT}}$ signal is at a logic high level (i.e., is inactive), the fourth FET 68 is turned OFF to enable the output signal line 60 to be influenced by the voltage level at the input pin 54 as discussed above. In addition, the third FET 66 is turned ON to provide a connection to the system ground 18 when the second FET 64 is turned on by a high logic level on the input pin 54. Thus, the NAND gate 51 operates as an inverting input buffer between the input pin 54 and the output 60 whenever the $\overline{\text{INHIBIT}}$ signal is at a logic high level.

Another preferred embodiment of the present invention 70 is illustrated in FIG. 8. The embodiment of FIG. 8 includes the ability to program the input buffer circuit to accommodate both active high and active low input signals which protecting the input buffer from burning out due to a floating input. The programmable input buffer circuit 70 is designed into the manufacturing of the part, and after the part is manufactured, each input pin can be programmed by an internal or external source to enable the input pin to accept either an active high or an active low signal. Furthermore, the input buffer circuit 70 is particularly advantageous because, unlike the embodiments of FIGS. 2–7, it does not invert the signal level of the input signal.

The programmable input buffer circuit 70 comprises a first two-input NAND gate 72, a second two-input NAND gate 74, and a third two-input NAND gate 76. A first input 77 of the first NAND gate 72 is connected to an input pin 80 that receives the input signal from an external source (not shown). A second input 78 of the first NAND gate 72 is connected to receive an active low $\overline{\text{INHIBIT}}$ signal on a line 82. The first NAND gate 72 is constructed in the same manner as the NAND gate 51 of FIGS. 5 and 7 so that a floating signal on the input pin 80 cannot damage the first NAND gate 72 when the $\overline{\text{INHIBIT}}$ signal on the line 82 is active low.

A first input 84 of the second NAND gate 74 is connected to receive an active high INHIBIT signal on a line 88. A second input 86 of the NAND gate 74 is connected to receive an active low $\overline{\text{HIACTIVE}}$ signal on a line 90. An output 92 of the first NAND gate 72 is connected to a first input 96 of the third NAND gate 76. An output 94 of the second NAND gate 74 is connected to a second input 98 of the third NAND gate 76. An output 100 of the third NAND gate 76 is the output of the programmable input buffer circuit 70 of this embodiment of the present invention.

The $\overline{\text{HIACTIVE}}$ signal is used to program the programmable input buffer circuit 70 for use with either an active high input signal or an active low input signal on the input pin 80. That is, as described below, when the programmable input buffer 70 is used with an active high input signal, the output 100 is forced low (i.e., inactive) whenever the INHIBIT signal is active. When the programmable input buffer 70 is used with an active low input signal, the output 100 is forced high (i.e., inactive) whenever the INHIBIT signal is active. Thus, the programmable input buffer 70 is programmable to provide the appropriate inactive signal to the circuitry (not shown) to which it is connected whenever the INHIBIT signal is activated.

FIG. 9 is a truth table which illustrates the operation of the circuit of FIG. 8 for different input conditions. For the circuit illustrated in FIG. 8, the $\overline{\text{INHIBIT}}$ signal on the line 82, an active low signal, is at the opposite logic level as the INHIBIT signal on the line 88, an active high signal, listed on the truth table of FIG. 9. Thus, the $\overline{\text{INHIBIT}}$ signal is not listed in the truth table.

The first four lines of the truth table of FIG. 9 illustrate the behavior of the circuit when the $\overline{\text{HIACTIVE}}$ signal on the line 90 is at an active low level, and the last four lines illustrated the behavior of the circuit when the $\overline{\text{HIACTIVE}}$ signal is at a logic high level.

When the circuit 70 of FIG. 8 has been programmed to receive an active high signal on the input pin 80, i.e., when the $\overline{\text{HIACTIVE}}$ signal on the line 90 is at a logic low level, as shown in the first four lines of the truth table of FIG. 9, and when the INHIBIT signal on the line 88 is at a logic high level and the $\overline{\text{INHIBIT}}$ signal on the line 82 is at a logic low level, as indicated in the third and fourth lines of the truth table, the output 100 of the input buffer circuit 70 is at an inactive low logic level irrespective of the voltage at the input pin 80. The active low $\overline{\text{INHIBIT}}$ signal on the input 78 to the first NAND gate 72 protects the CMOS input buffer circuit 70 from floating voltage levels at the input pin 80, as discussed above in connection with FIGS. 5–7. On the other hand, when the INHIBIT signal is at an inactive logic low level and the $\overline{\text{INHIBIT}}$ signal is at an inactive logic high level, the signal at the input pin 80 is allowed to pass through the first NAND gate 72 and the third NAND gate 76 to the output 100 of the input buffer circuit 70 without being inverted. Thus, when the signal at the input pin 80 is at a logic low level, the output 100 is at a logic low level, and when the signal at the input pin 80 is at a logic high level, the output 100 is at a logic high level. Thus, when the input buffer 70 is programmed for an active high signal, the output 100 of the input buffer circuit 70 is inhibited to an inactive low logic level and operates as a non-inverting buffer when it is not inhibited. This has the effect of making the buffer effectively transparent to the circuit to which it is connected while protecting that circuit against floating inputs.

The last four lines (i.e., lines 5-8) of FIG. 9 illustrate the input circuit behavior when the input buffer circuit 70 has been programmed for an active low input signal, i.e., the $\overline{\text{HIACTIVE}}$ signal on the line 90 is at a logic high level. When the INHIBIT signal on the line 88 is at a logic high level and the $\overline{\text{INHIBIT}}$ signal on the line 82 is at a logic low level, the output 100 of the input buffer circuit 70 is forced to an inactive logic high level irrespective of the voltage at the input pin 80. Again, the active low $\overline{\text{INHIBIT}}$ signal on the line 82 protects the first NAND gate 72 from any floating signals on the input pin 80. When the INHIBIT signal is at a logic low level and the $\overline{\text{INHIBIT}}$ signal is at a logic high level, the logic level of the signal at the input pin 80 is propagated to the output 100 of the buffer circuit 70 via the first NAND gate 72 and the third NAND gate 76 and is not inverted. When the signal at the input pin 80 is at a logic low level, the output 100 of the buffer circuit 70 is at a logic low level. When the signal at the input pin 80 is at a logic high level, the output 100 of the buffer circuit 70 is at a logic high level. As before, the programmable buffer circuit 70 is effectively transparent to the circuit to which it is connected when not inhibited and provides an inactive logic level when it is inhibited.

One advantage of the input buffer circuit 70 of FIG. 8 is that the input pin 80 can be programmed to accept either an active high signal or an active low signal after the IC is manufactured. Often, the input pins are not assigned to specific signals when the chip is manufactured so it is extremely difficult to determine if the input signal is going to be an active high or an active low signal. In the embodiment of the input buffer circuit 70 illustrated in FIG. 8, each input pin 80 can be programmed after the IC is manufactured for the type of signal that will be connected to the input pin 80. In one application of the embodiment of the input buffer 70 of FIG. 8, the $\overline{\text{HIACTIVE}}$ signal on the line 90 is generated internally by the integrated circuit into which the input buffer 70 is incorporated and is sent to each of the input pins 80 during a system power up period. In another application, the $\overline{\text{HIACTIVE}}$ signal is generated externally and is sent to a specialized input pin (not shown) which routes the $\overline{\text{HIACTIVE}}$ signal to each input buffer circuit 70 in the integrated circuit.

Another embodiment of the input buffer circuit 110 is illustrated in FIG. 10. The buffer circuit 110 is programmable and is identical to the embodiment illustrated in FIG. 8, and is numbered accordingly, except that the $\overline{\text{INHIBIT}}$ signal on the line 82 is replaced by a $\overline{\text{PROTECT}}$ signal on a line 112. The $\overline{\text{PROTECT}}$ signal is used to ensure that the system power supply 16 is not shorted to the system ground 18 through the FETs in the input buffer circuit 110 when the voltage of the input pin 80 is floating. In this case, once the INHIBIT signal on the line 88 connected to the second two-input NAND gate 74 has been initiated to provide a constant voltage on the output 114 of the input buffer circuit 110, the floating voltage on the input pin 80 is controlled by initiating the $\overline{\text{PROTECT}}$ signal. It is preferred that the INHIBIT signal be applied first to provide the constant voltage at the output 114. Then, the $\overline{\text{PROTECT}}$ signal be applied to prevent the system power supply 16 from being shorted to the system ground 18. Once the voltage at the output 114 is set and the power supply 16 is protected from shorting to the system ground, the external logic can be powered down without worrying about damaging the system power supply 16 or the input buffer circuit 110. When the external circuitry is powered ON, the system should wait for the power to stabilize before the input protection is removed. First, the $\overline{\text{PROTECT}}$ signal should be removed to enable the connection of the system power supply 16 or the system ground 18 to the output 114 of the input buffer circuit 110. Secondly, the INHIBIT signal should be removed to remove the constant voltage from the output 114. The input buffer circuit 110 allows the user to separate the function of protecting the FETs from shorting the power supply 16 to the system ground 18 when inputs may be floating from the function of providing a constant voltage on the output 114 of the buffer circuit 110. Therefore, this embodiment 110 is preferred if it is advantageous for the user to separate the two functions of transistor protection and voltage control.

The present invention may be embodied in other specific forms without departing from its spirit or essential characteristics. The described embodiments are to be considered in all respects only as illustrative and not restrictive. The scope of the invention is, therefore, indicated by the appended claims rather than the foregoing description. All changes which come within the meaning and range of equivalency of the claims are to be embraced within their scope.

What is claimed is:

1. A programmable buffer circuit for buffering an input signal that floats at a voltage level between a high logic level and a low logic level, said programmable buffer circuit comprising:

a first input terminal that receives said input signal, said input signal having a high input logic level, a low input logic level and a floating level, said floating level being a variable level between said high input logic level and said low input logic level;

a second input terminal that receives a control signal, said control signal having a first control signal state and a second control signal state;

a third input terminal that receives a programming signal, said programming signal having a first programming signal state and a second programming signal state;

an output terminal that provides an output signal, said output signal having a first output logic level and a second output logic level; and logic circuitry coupled between said first input terminal, said second input terminal, said third input terminal and said output terminal, said logic circuitry responsive to said input signal, said control signal and said programming signal, said output signal being responsive to said input signal when said control signal has said first control state to have one of said first and second output logic levels when said input signal has one of said first and second input logic levels and to have the other of said first and second output logic levels when said input signal has the other of said first and second input logic levels, said output signal being forced to a predetermined one of said first and second output logic levels when said control signal has said second control state, the predetermined one of said first and second output logic levels being determined by said programming signal.

2. The programmable buffer circuit as defined in claim 1, wherein said input signal is prevented from causing a system power supply to be shorted to a system ground when said control signal has said second state.

3. The programmable buffer circuit as defined in claim 1, wherein said input signal has an active logic level and an inactive logic level, and wherein said programming signal is selected to have a selected one of said first and second programming states so that said predetermined one of said first and second output logic levels to which said output signal is forced has the same logic level as said inactive logic level.

4. The programmable buffer circuit as defined in claim 1, additionally comprising a fourth input terminal which receives a protect signal, said protect signal having a first protect signal state and a second protect signal state, wherein said protect signal is selected to have a selected one of said first and second protect states so that said input signal is prevented from causing a system power supply to be shorted to a system ground.

* * * * *